United States Patent
Schultz-Wittmann et al.

(10) Patent No.: US 8,236,689 B2
(45) Date of Patent: Aug. 7, 2012

(54) METHOD FOR APPLYING A STRUCTURE TO A SEMICONDUCTOR ELEMENT

(75) Inventors: Oliver Schultz-Wittmann, Sunnyvale, CA (US); Filip Granek, Freiburg (DE); Andreas Grohe, Freiburg (DE)

(73) Assignee: Fraunhofer-Gesellschaft zur Forderung der Angewandten Forschung E.V., Munich (DE)

( * ) Notice: Subject to any disclaimer, the term of this patent is extended or adjusted under 35 U.S.C. 154(b) by 126 days.

(21) Appl. No.: 12/446,804

(22) PCT Filed: Dec. 20, 2007

(86) PCT No.: PCT/EP2007/011251
§ 371 (c)(1),
(2), (4) Date: Apr. 14, 2010

(87) PCT Pub. No.: WO2008/095526
PCT Pub. Date: Aug. 14, 2008

(65) Prior Publication Data
US 2010/0301456 A1    Dec. 2, 2010

(30) Foreign Application Priority Data
Feb. 6, 2007  (DE) .......................... 10 2007 006 640

(51) Int. Cl.
*H01L 21/441* (2006.01)
(52) U.S. Cl. ......... 438/670; 257/E21.023; 257/E21.025; 257/E21.033; 438/669
(58) Field of Classification Search ........... 257/E21.023, 257/E21.025, E21.034; 438/669, 670
See application file for complete search history.

(56) References Cited

U.S. PATENT DOCUMENTS

| | | | | |
|---|---|---|---|---|
| 3,419,425 A | * | 12/1968 | Conrad | 438/670 |
| 3,873,361 A | * | 3/1975 | Franco et al. | 430/324 |
| 3,934,057 A | | 1/1976 | Moreau et al. | |
| 4,132,586 A | * | 1/1979 | Schaible et al. | 438/669 |
| 4,202,914 A | * | 5/1980 | Havas et al. | 204/192.32 |
| 4,493,855 A | * | 1/1985 | Sachdev et al. | 438/670 |
| 4,564,584 A | | 1/1986 | Fredericks et al. | |
| 4,564,997 A | | 1/1986 | Matsuo et al. | |
| 4,567,132 A | * | 1/1986 | Fredericks et al. | 430/312 |
| 4,757,033 A | * | 7/1988 | Ebata | 438/670 |
| 5,773,333 A | * | 6/1998 | Jo | 438/179 |
| 6,380,078 B1 | | 4/2002 | Liu et al. | |
| 6,867,116 B1 | | 3/2005 | Chung | |
| 7,700,482 B2 | * | 4/2010 | Kamijima | 438/670 |
| 7,718,347 B2 | * | 5/2010 | Borden | 430/311 |
| 7,871,908 B2 | * | 1/2011 | Yatsuda et al. | 438/531 |
| 7,923,270 B2 | * | 4/2011 | Tanaka et al. | 438/22 |
| 2012/0009733 A1 | * | 1/2012 | Delgado et al. | 438/107 |

FOREIGN PATENT DOCUMENTS
JP    57176727    10/1982
(Continued)

*Primary Examiner* — Allan R Wilson
(74) *Attorney, Agent, or Firm* — Volpe and Koenig, P.C.

(57) ABSTRACT

A method for applying a predetermined structure of a structural material to a semiconductor element. The method includes the following steps: A) partially covering a surface of the semiconductor element with a masking layer, B) applying a film of a structural material to the masking layer and to the surface of the semiconductor element in the zones that are devoid of the masking layer and C) removing the masking layer together with the structural material present on the masking layer. The method according to the invention provides that between process steps B and C, the film of structural material is partially removed in a process step B2.

16 Claims, 2 Drawing Sheets a)    b)

c)    d)

e)    f)

FOREIGN PATENT DOCUMENTS

| | | |
|---|---|---|
| JP | 59047740 | 3/1984 |
| JP | 60147122 | 8/1985 |
| JP | 61063026 | 4/1986 |
| JP | 62171169 | 7/1987 |
| JP | 2003258256 | 9/2003 |

* cited by examiner a)

b)

c)

d)

e)

f)

METHOD FOR APPLYING A STRUCTURE TO A SEMICONDUCTOR ELEMENT

BACKGROUND

The invention relates to a method for applying a structure made from a structural material onto a semiconductor element and also to a semiconductor structure.

Methods are known in semiconductor technology to deposit thin metallization structures onto a semiconductor element. Thus it is known, for example, to deposit a metal structure onto a silicon wafer, wherein a photosensitive lacquer is initially deposited onto the silicon wafer. The photosensitive lacquer is then exposed via an exposure mask, so that the areas of the photosensitive lacquer on the silicon wafer at which, at a later time, metal should be located on the surface are exposed. After the exposure, the lacquer is developed so that the exposed areas of lacquer are removed.

In the next step, a metal film is now deposited over the entire surface, so that, first, the metal film lies on the remaining lacquer and, second, the metal film is deposited on the silicon wafer in the areas in which the lacquer was removed.

Finally, through the use of solvents, the remaining lacquer is also removed, so that, in this step, the metal film is also removed in the areas in which it lies on the lacquer.

As a result, a predetermined metal structure remains on the silicon wafer. The method described above is also known as the "lift-off method."

In this method, it is essential that the solvent must reach through the metal film to the lacquer lying under the metal film, in order to strip this lacquer. For this purpose, either long processing times for the stripping process are needed, so that the solvent can penetrate via small pores through the metal film or alternatively the lacquer can be stripped in some areas, so that the stripping process eventually continues to all of the areas covered with lacquer.

Likewise, from U.S. Pat. No. 3,934,057 it is known to perform a two-stage lacquer coating method, so that, after the deposition, the metal film does not form a connection over an area, but instead, the areas in which the metal film lies on the lacquer and the areas in which the metal film lies directly on the silicon wafer are separated from each other by gaps. In this way, the solvent can reach through the mentioned gaps to the lacquer.

This method, however, has the disadvantage that a cost-intensive and time-intensive lacquer coating step with at least two stages is required.

SUMMARY

Therefore the invention is based on the desire to improve the known method for depositing a predetermined structure made from a structural material onto a semiconductor element, so that, in particular, the processing times could be decreased and also costs could be saved. Furthermore, through the method according to the invention, lower requirements should be placed on the solvent to be used for stripping the lacquer and on the materials from which the masking layer is formed, so that, first, costs can be saved and, second, the environmental burden caused by the processing waste products can be reduced.

This is achieved by a method according to the invention and also by a semiconductor layer structure according to the invention. Advantageous constructions of the method are described below.

The method according to the invention is thus suitable for depositing a structure made from a structural material onto a semiconductor element. This includes the deposition described above of a metal structure onto a semiconductor element. Likewise, however, any other structures made from any other structural materials could be deposited onto the semiconductor element by the use of the method according to invention.

In the production of the structure, initially in a step A, a surface of the semiconductor element is partially covered by a masking layer, so that the regions on which, after completion of the method, the structural material should be located on the surface of the semiconductor element are spared from the masking layer. Then, in a step B, a film of the structural material is deposited, so that the structural material covers, first, the masking layer and, second, the surface of the semiconductor element in the areas devoid of the masking layer.

In a processing step C, as described above, a "lift-off" method is performed, that is, the masking layer is stripped, so that the structural material located on the masking layer is also stripped. As a result, structural material remains on the surface of the semiconductor element in the predetermined regions devoid of the masking layer.

It is essential that the film made from structural material is partially removed between the processing steps B and C in a processing step B2. Thus, before stripping the masking layer, openings are generated in the film made from structural material. Therefore, it is possible for the solvent that strips the masking layer in step C to be led through the film made from structural material to the masking layer through the openings generated in processing step B2, so that the stripping process is set in motion.

In this way, a considerable acceleration of the processing step C can be achieved, because the stripping process is initiated immediately through the openings achieved in the processing step B2. Likewise, complicated and cost-intensive methods that modify the masking layer—as described in the introduction—such that a closed metal film is not generated can be eliminated.

Thus, an acceleration of the process with simultaneous cost savings is possible.

Advantageously, in the processing step B2 in the method according to the invention, the structural material is partially removed in the areas in which the film was deposited onto the masking layer. In this way, in processing step C, the solvent can be led directly to the masking layer through the resulting open areas and can initiate the stripping process.

Advantageously, in the processing step B2, the film made from structural material is perforated, that is, pierced at several perforation points in an approximately regular arrangement. Here, it is especially advantageous if the perforations, that is, the individual through holes, are selected such that a given maximum distance between two through holes is not exceeded. Therefore, it is guaranteed that each point of the masking layer is at a distance from a through hole by a maximum of the given maximum distance, that is, from an area in which the film made from structural material was removed and the solvent directly attacks the masking layer. In this way the time period is also limited that is needed for the stripping process, because the stripping process must advance between two perforation points by a maximum of the given maximum distance.

Studies of the applicant have shown that the perforations are advantageously to be spaced apart a maximum of 5000 µm, in particular, at most by 1000 µm, very especially at most by 500 µm.

In another advantageous configuration of the method, the film made from structural material is at least perforated in processing step B2 along at least one predetermined line.

It is also conceivable to completely remove the film made from structural material along the predetermined line. The complete removal of the structural material along the lines produces the advantage that, for possibly undesired structural material remaining on the semiconductor element outside of the areas devoid of the masking layer, due to the lines there is a separation between this structural material and the structural material remaining in the spared areas. In this way, for example, for metallization there is no electrical contact between a metal structure in the spared (non-masked) areas and undesired metal residues outside of these areas and short circuits can be prevented.

The lines are advantageously specified such that they follow the spared areas, i.e., in approximately the shape and profile of the edges of the spared (non-masked) areas.

In this way it is possible to specify the predetermined lines in the vicinity of the edges of the areas spared from the masking layer, so that a defined stripping process can be initiated especially along the structure remaining on the surface of the semiconductor element after the completion of the method.

For this purpose, it is especially advantageous when a line as described above is specified on at least two sides of the predetermined structure and the film made from structural material is perforated or completely removed along this line. Complete removal can be performed, e.g., by a pulsed laser in which the areas removed by the laser pulses overlap.

Advantageously, the predetermined line has an essentially constant distance to the predetermined structure, i.e., to the edges of the spared (non-masked) areas. This has the following background:

As described above, in the areas spared from the masking layer, the structural material remains on the surface of the semiconductor element. Thus, at the edges of the spared areas, during the stripping of the masking layer, the film made from structural material peels away, because, first, the structural material in the spared areas remains on the surface of the semiconductor element and, second, the structural material that is located on the masking layer is also stripped.

Through the perforation or the complete removal of the structural material along a predetermined line that runs along the spared areas, a defined onset point for the peeling-off process can be specified, so that the forces that act on the structural material remaining on the surface of the semiconductor element are reduced and undesired peeling of the structural material in the spared areas can be prevented.

Studies of the applicant have shown that, advantageously, the predetermined lines lie approximately at the edges of the spared areas, i.e., the distance of the predetermined line to the edges of the spared areas is approximately 0. In this way, forces on the structural material remaining on the semiconductor element are avoided during the stripping process and undesired peeling of the structural material from the spared areas can be prevented.

By specifying the line approximately at the edges of the spared areas, another significant advantage is similarly produced:

So that the previously described peeling of the film made from structural material takes place, a minimum force acting on the film is needed. The force acting on the edges of the spared areas here also depends on the size of the area of the film stripped by the solvent: the greater the stripped area, the greater the force acting on the film at the edges of the spared areas. For small distances of the predetermined line to the edges of the spared areas it is possible that the film does not peel away due to forces that are too small and thus a part of the film made from structural material is not stripped outside of the spared areas.

To take into account calibration inaccuracies for the removal of the structural material in processing step B2, it is advantageous when the distance lies in the range of 10 µm to 20 µm, so that even for calibration inaccuracies, no structural material is removed in the spared areas.

If there is good mechanical contact, i.e., a good bond between the structural material and the surface of the semiconductor element, the stripping process in processing step C can be accelerated even more such that the predetermined lines have a greater distance, i.e., at least a predetermined distance to the edges of the spared areas, because, in this case, the stripping process is initiated starting from the predetermined lines both in the direction of the edges of the spared areas and also in the opposite direction.

Another advantage of such a predetermined minimum distance is that, in this way, sufficiently large forces are generated on the film made from structural material at the edges of the spared areas, so that peeling takes place and undesired film residue remaining on the semiconductor element due to forces that are too low as described above is avoided. To guarantee peeling, it is thus advantageous to specify either the predetermined line approximately on the edges of the spared areas or to maintain a minimum distance to these edges.

Studies of the applicant have shown that, here, a distance of at least 100 µm, in particular, approximately 500 µm is advantageous.

Furthermore, it is advantageous when the film made from structural material is perforated or completely removed along a line at least on two sides of a spared area.

In another advantageous configuration of the method according to the invention, the entire film made from structural material is provided in processing step B2 with grid-like perforations. Here, advantageously the areas not covered by the masking layer are spared, so that the film made from structural material is not pierced in the areas in which the structure is to be generated on the semiconductor element. These grid-like perforations lead to a number of attack points for the solvent on the masking layer, so that an optimum acceleration of the stripping process is achieved in the processing step C.

The partial removal of the film made from structural material in processing step B2 can be performed, advantageously, mechanically. This is conceivable, for example, by scribing with pointed or blade-like devices, milling or cutting with the use of a rotating cutting blade is also possible.

It is especially advantageous, however, when in processing step B2 the film made from structural material is partially removed by a localized radiation effect. Tests of the applicant have shown that, in particular, partial removal of the film is advantageous through the use of a laser. For this purpose, devices are known that allow an exact positioning of the laser beam relative to the semiconductor element and also a quick change between several points on the surface of the semiconductor element, for example, through the use of rotating mirrors in the beam path of the laser beam. In this way, in a very short time, the film made from structural material can be perforated at a large number of points, especially through the evaporation of the structural material by the laser beam.

In addition, through the use of a laser, a milling head or cutting blade is not worn away, so that corresponding maintenance work is eliminated.

For the partial removal of the film made from structural material in processing step B2, this removal process is to be selected such that the semiconductor element is not negatively affected, in particular, that the electrical properties of the semiconductor element are not changed or negatively affected, for example, by the introduction of discontinuous points in the semiconductor structure.

Here it is advantageous when the energy of the radiation for removing the film made from structural material and the thickness of the masking layer has a predetermined minimum thickness, so that the laser beam indeed possibly causes a change in the masking layer, but no change to the semiconductor element below the masking layer.

Studies of the applicant have shown that, for the production of a metallization structure, a thickness of the masking layer of at least 1 µm, especially at least 5 µm, very especially 10 µm, furthermore, in particular, in the range from 20 µm to 40 µm is advantageous for the use of a laser for opening the metal film.

The partial covering of the surface of the semiconductor with the masking layer in processing step A can be performed by a known photolithography method:

For this purpose, at first in a processing step A1 the surface of the semiconductor element is covered with a photosensitive lacquer.

Then the photosensitive lacquer in a processing step A2 is exposed in the areas in which the surface of the semiconductor element is to be covered with the structural material.

Then, in a processing step A3 the photosensitive lacquer is developed, so that only the exposed areas of the photosensitive lacquer are removed from the surface of the semiconductor element.

Alternatively, the use of a so-called "negative lacquer" is also conceivable, that is, a lacquer in which the non-exposed areas are stripped during the development. Accordingly, in this case the areas of the surface of the semiconductor element in which covering by the structural material is desired do not need to be exposed.

However, for the use of the method according to the invention for the metallization of solar cells, in particular, it is advantageous when the masking layer in processing step A is deposited onto the semiconductor element, that is, onto the solar cell wafer, by known screen-printing methods or by known ink-jet methods. An overview of the technology of the ink jet printing method is to be found in J. Heinzl, C. H. Hertz, "Ink-Jet Printing," Advances in Electronics and Electron Physics, Vol. 65 (1985), pp. 91-112.

These methods represent especially economical production methods that contribute to further cost reduction in the production of the solar cell in connection with the partial removal of the film made from structural material, especially under the use of a laser, according to the invention.

As described above, in known methods, a long action period in processing step C is often needed for stripping the masking layer by the solvent. Therefore, known methods must turn back to high-quality and thus cost-intensive solvents that do not attack the film made from structural material, that is, in particular, a metal film, even for long action times.

Through the method according to the invention, however, only a shorter action time of the solvent is needed for stripping the masking layer, so that economical solvents that would negatively affect the semiconductor element and/or the metal film for long action times could be used and also environmentally-friendly solvents could be used.

In particular, the use of alkali solvents, such as weakly concentrated potash lye (e.g., KOH lye diluted to 3%) is advantageous.

Furthermore, advantageously a dibasic ester could be used like that offered, e.g., by LEMRO, chemical products, Michael Mrozyk K G, D-41515 Grevenbroich under the designation "DBE". Here, the additional advantage is produced that a metal film is not attacked by the dibasic ester.

Furthermore, for the method according to the invention, a typical cover lacquer could be used for the masking layer deposited by screen-printing or ink-jet methods, especially the cover lacquer offered by Lackwerken Peters GmbH+Co KG, D-47906 under the designation "SD 2154E". This lacquer can be stripped using the previously described "DBE".

Another possibility is the use of the lacquer with the designation "SD 2042AL" of the same supplier, wherein this lacquer could be stripped using KOH lye.

For the use of the method according to the invention for the production of a metallization structure on a semiconductor element, it is especially advantageous when, in processing step B, the metal is deposited by vapor deposition or sputtering.

BRIEF DESCRIPTION OF THE DRAWINGS

An embodiment of the method according to the invention will be explained in greater detail below with reference to the figures. Shown are.

DETAILED DESCRIPTION OF THE PREFERRED EMBODIMENTS

Figure 1:
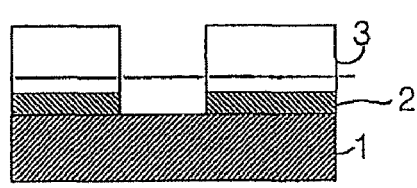
FIG. 1 a schematic diagram of the method according to the invention for the production of a metallization structure on a solar cell, and FIG. 2 a plan view of a solar cell with a metallization structure, wherein it is indicated by points at what positions perforations are generated by the method according to the invention.
Figure 1:
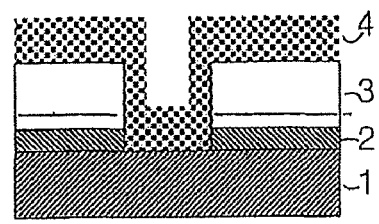
Figure 1:
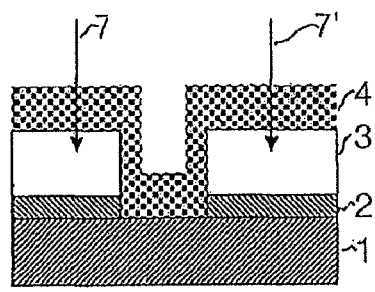
Figure 1:
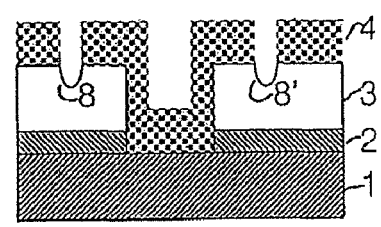
Figure 1:
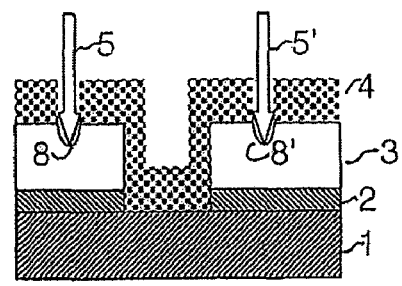
Figure 1:
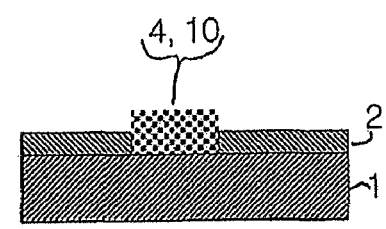

As previously described, the method according to the invention is suitable especially for depositing a metallization structure onto a solar cell. Such a method is shown in FIG. 1. Here, in sub-figure a) a semiconductor element is shown that is constructed as solar cell 1 that in this example is composed of a silicon wafer with corresponding doping for generating a pn junction. The diagram in sub-figure a) represents a processing stage in which a dielectric layer 2 was already masked by a masking layer 3.

On the solar cell 1, a dielectric layer 2 was deposited over the entire area and on this layer a masking layer 3 was printed by screen printing, wherein this masking layer does not cover the areas in which metallization of the solar cell is desired. The masking layer 3 is composed of the previously mentioned lacquer "SD 2154 E", that is, the masking layer represents an etching resist and is not attacked by etching substances. Thus, through an etching step, the dielectric layer 2 could be etched in the areas that are spared from the masking layer 3. The masking layer 3 has a thickness in the range from 20 µm to 40 µm.

As shown in FIG. 1, sub-figure b), a film made from structural material that is realized, in this case, as a metal film 4, is then deposited over the entire area. In a known way, the metal film 4 is deposited by vapor deposition and is comprised of several layers: initially, an aluminum layer with approximately 300 nm thickness is vapor deposited, then an approximately 30 nm thick layer of titanium, and then an approximately 100 nm thick layer of silver. In this way, first, a good electrical and mechanical contact between metal structure and semiconductor and, second, a low ohmic transverse conductance resistance of the metal structure is guaranteed.

As is clear in sub-figure b), the metal film 4 thus covers, first, the masking layer 3 and, second, the solar cell 1 in the areas spared from the masking layer 3.

In another step, now through the use of laser beams 7, 7', the metal film 4 will be perforated, see FIG. 1, sub-figure c). The result is shown in sub-figure d):

Through the introduction of the energy of the laser beams 7, the metallization layer 4 was vapor deposited locally at individual points 8, 8'. Here, the thickness of the masking layer 3 and the intensity of the laser beams 7, 7' are selected so that, first, the metal film 4 is completely removed in the perforation areas 8, 8' and, second, there is no negative effect on the solar cell 1 or the dielectric layer 2 by the laser beams 7, 7'. The pulse energy of the laser beam was selected here lower than 5 µJ, in order to avoid a negative effect on the solar cell by the laser beams. In particular, a pulse energy of 2 µJ is advantageous according to studies of the applicant.

The perforation was performed by a frequency-tripled Nd:YAG laser with a wavelength of 355 nm. The laser works with pulsed laser radiation, wherein the pulse lengths lie in the range from 20 ns to 30 ns.

In another step, the entire structure is now placed in a solvent bath, so that, especially at the openings 8, 8' of the metal film 4 designated with arrows in FIG. 1, sub-figure e), the solvent 5, 5' is led to the masking layer 3 directly through the openings and strips this masking layer.

In this way, rapid stripping of the masking layer 3 is possible, so that the structure shown in FIG. 1, sub-figure f) is generated, that is, the solar cell 1 with the dielectric layer 2 that has, at the desired recess positions, a metallization structure 10 comprised of the remaining areas of the metal film 4.

Figure 2:
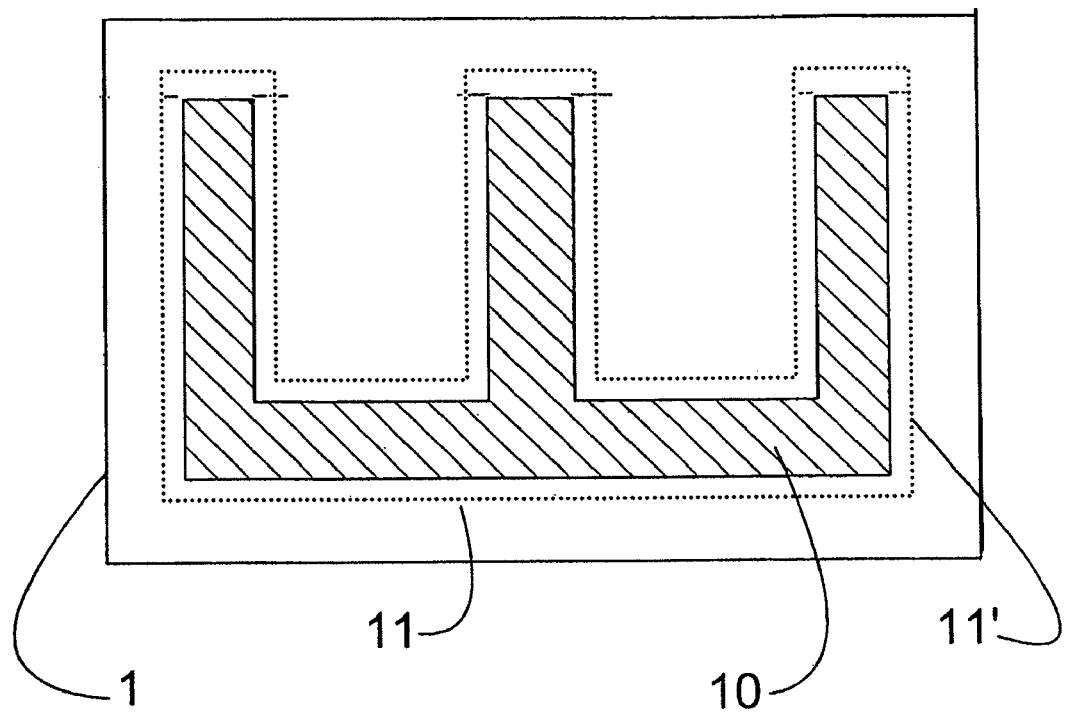

In FIG. 2, a plan view of a solar cell with a greatly simplified, comb-like metallization structure 10 is shown.

The solar cell 1 has a comb-like metallization structure 10 by which charge carriers can be led out of the silicon wafer via the metallization structure to a (not-shown) contact point.

The points in FIG. 2 indicate the perforations along predetermined lines of which, for example, two lines are designated with the reference symbols 11, 11'. At the lines, the metal film 4 was partially removed by the method according to the invention. The shown perforations follow lines that are arranged at an approximately constant distance of 500 µm to the areas spared from the masking layer, that is, to the metallization structure 10, so that a defined peeling of the metal film at the edges of the metallization structure 10 is given.

A typical comb-like metallization structure, as shown schematically in FIG. 2, typically has, starting from the connection area at the bottom in FIG. 2, a plurality (greater than 80) of "fingers" extending upward starting from this connection area in FIG. 2, wherein the fingers have an approximate distance of 1200 µm to each other and a width of approximately 150 µm.

The invention claimed is:

1. Method for depositing a predetermined structure made from a structural material onto a semiconductor element, comprising the following steps:
    A) partially covering a surface of the semiconductor element with a masking layer,
    B) depositing a film made from the structural material onto the masking layer and onto a surface of the semiconductor element in areas spared from the masking layer,
    B2) partially removing the film made from the structural material,
    C) stripping the masking layer with the structural material located on the masking layer, and
    wherein in processing step B2, the film made from the structural material is partially removed in the areas in which the film was deposited onto the masking layer.

2. Method according to claim 1, wherein in processing step B2, the film made from the structural material is perforated with individual perforation areas having a maximum distance of at most 5000 µm.

3. Method according to claim 1, wherein the film made from the structural material is at least perforated in processing step B2 along at least one predetermined line.

4. Method according to claim 3, wherein the film made from the structural material is removed along the at least one predetermined line.

5. Method according to claim 3, wherein the predetermined line approximately corresponds to a profile of at least one part of edges of the predetermined structure, wherein the predetermined line has a predetermined, essentially constant distance to the edges of the predetermined structure.

6. Method according to claim 5, wherein the film made from the structural material is perforated along a line or completely removed at least on two sides of the predetermined structure.

7. Method according to claim 1, wherein in processing step B2, the film made from the structural material is partially removed mechanically.

8. Method according to claim 7, wherein the film is removed by milling.

9. Method according to claim 1, wherein in processing step B2, the film made from structural material is partially removed by a localized radiation effect.

10. Method according to claim 9, wherein the structural material which comprises metallization structure is removed by a laser.

11. Method according to claim 1, further comprising: utilizing localized radiation to at least partially remove the structural material in which the localized radiation is selected such that it has a pulse energy less than 5 µJ.

12. Method according to claim 1, wherein the masking layer is made from photosensitive lacquer and that the processing step A further comprises the following processing steps:
    A1) covering a surface of the semiconductor element with the photosensitive lacquer,
    A2) partially exposing the photosensitive lacquer,
    A3) developing the photosensitive lacquer, and
    A4) stripping exposed or non-exposed areas of the photosensitive lacquer.

13. Method according to claim 1, wherein in processing step A the masking layer is deposited by screen printing or by an ink-jet method.

14. Method according to claim 1, wherein in step C, the masking layer is removed by a dibasic ester or by alkali solvents.

15. Method according to claim 1, wherein the structure is a metallization structure and in processing step B, the film made from the structural material is a metal film and the metal film is deposited by vapor deposition or sputtering.

16. Semiconductor layer structure comprising,
    a semiconductor element,
    a masking layer that covers a surface of the semiconductor element,
    a film made from structural material that covers the masking layer and covers the semiconductor element in areas spared from the masking layer,
    the film made from structural material has open areas that are generated according to claim 1.

* * * * *